United States Patent
Lee

(10) Patent No.: US 8,149,037 B2
(45) Date of Patent: Apr. 3, 2012

(54) CLOCK DUTY CORRECTION CIRCUIT

(75) Inventor: Hye Young Lee, Ichon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 27 days.

(21) Appl. No.: 12/841,038

(22) Filed: Jul. 21, 2010

(65) Prior Publication Data

US 2011/0267123 A1     Nov. 3, 2011

(30) Foreign Application Priority Data

Apr. 30, 2010    (KR) .................. 10-2010-0040662

(51) Int. Cl.
*H03K 3/017*    (2006.01)
*H03K 5/04*    (2006.01)

(52) U.S. Cl. .................. 327/175; 327/172; 327/291

(58) Field of Classification Search .............. 327/172, 327/175

See application file for complete search history.

(56) References Cited

U.S. PATENT DOCUMENTS

| | | | |
|---|---|---|---|
| 6,897,693 B2 | 5/2005 | Kim | |
| 6,917,229 B2 | 7/2005 | Cho | |
| 6,940,328 B2 * | 9/2005 | Lin | 327/175 |
| 7,414,483 B2 * | 8/2008 | Shimamoto | 331/44 |
| 7,466,177 B2 * | 12/2008 | Huang et al. | 327/175 |
| 7,586,349 B2 * | 9/2009 | Tambouris | 327/175 |
| 7,741,893 B2 * | 6/2010 | Cheon et al. | 327/291 |
| 7,944,262 B2 * | 5/2011 | Kuroki et al. | 327/175 |
| 2004/0174196 A1 * | 9/2004 | Hochschild et al. | 327/175 |
| 2008/0231329 A1 * | 9/2008 | Lee et al. | 327/108 |

FOREIGN PATENT DOCUMENTS

| | | |
|---|---|---|
| KR | 1020070071106 A | 7/2007 |
| KR | 1020100002651 A | 1/2010 |

* cited by examiner

*Primary Examiner* — Ryan Jager

(74) *Attorney, Agent, or Firm* — William Park & Associates Ltd.

(57) ABSTRACT

A clock duty correction circuit includes a first current sourcing unit that sources a current to a current path in response to a clock signal, a first current sinking unit that sinks the current of the current path in response to the clock signal, a second current sourcing unit that sources a current to the current path in response to a delay clock signal obtained by delaying the clock signal by a predetermined time, a second current sinking unit that sinks the current of the current path in response to the delay clock signal, a current adjustment unit that adjusts an amount of the current flowing through the current path according to a voltage level of a control voltage, and a clock output unit that outputs an output clock signal having a voltage level corresponding to the amount of the current flowing through the current adjustment unit.

21 Claims, 3 Drawing Sheets

(a) When V_CTRL is at High Level (b) When V_CTRL is at Low Level

CLOCK DUTY CORRECTION CIRCUIT

CROSS-REFERENCES TO RELATED APPLICATION

The present application claims priority under 35 U.S.C. §119(a) to Korean application No. 10-2010-0040662, filed on Apr. 30, 2010, in the Korean Intellectual Property Office, which is incorporated herein by reference in its entirety as if set forth in full.

BACKGROUND

1. Technical Field

The present invention relates to a semiconductor apparatus, and more particularly, to a technology for adjusting the duty of a clock.

2. Related Art

Semiconductor apparatuses and integrated circuits have been continuously improved to increase the degree of integration and improve the operation speed thereof. Such semiconductor apparatuses and integrated circuits operate in synchronization with a periodic pulse signal such as a clock to improve the operation speed and the efficiency of an internal operation. Therefore, most semiconductor apparatuses and integrated circuits operate using an externally supplied clock or an internally generated clock, if necessary.

In order to ensure a timing margin of a circuit operating synchronously with a clock signal, it may be necessary to adjust the duty of the clock signal. Adjustment of the duty of the clock signal means adjustment of the ratio of the high level period to the low level period of the clock signal. This is also called a duty ratio adjustment. Since the clock signal determines an operation timing of an internal circuit, a technology for stably adjusting the duty of the clock signal is needed.

SUMMARY

In one embodiment of the present invention, a clock duty correction circuit includes: a first current sourcing unit configured to source a current to a current path in response to a clock signal; a first current sinking unit configured to sink the current of the current path in response to the clock signal; a second current sourcing unit configured to source a current to the current path in response to a delay clock signal obtained by delaying the clock signal by a predetermined time; a second current sinking unit configured to sink the current of the current path in response to the delay clock signal; a current adjustment unit configured to adjust an amount of the current flowing through the current path according to a voltage level of a control voltage; and a clock output unit configured to output an output clock signal having a voltage level corresponding to the amount of the current flowing through the current adjustment unit.

BRIEF DESCRIPTION OF THE DRAWINGS

Features, aspects, and embodiments are described in conjunction with the attached drawings, in which.

DETAILED DESCRIPTION

Figure 1:
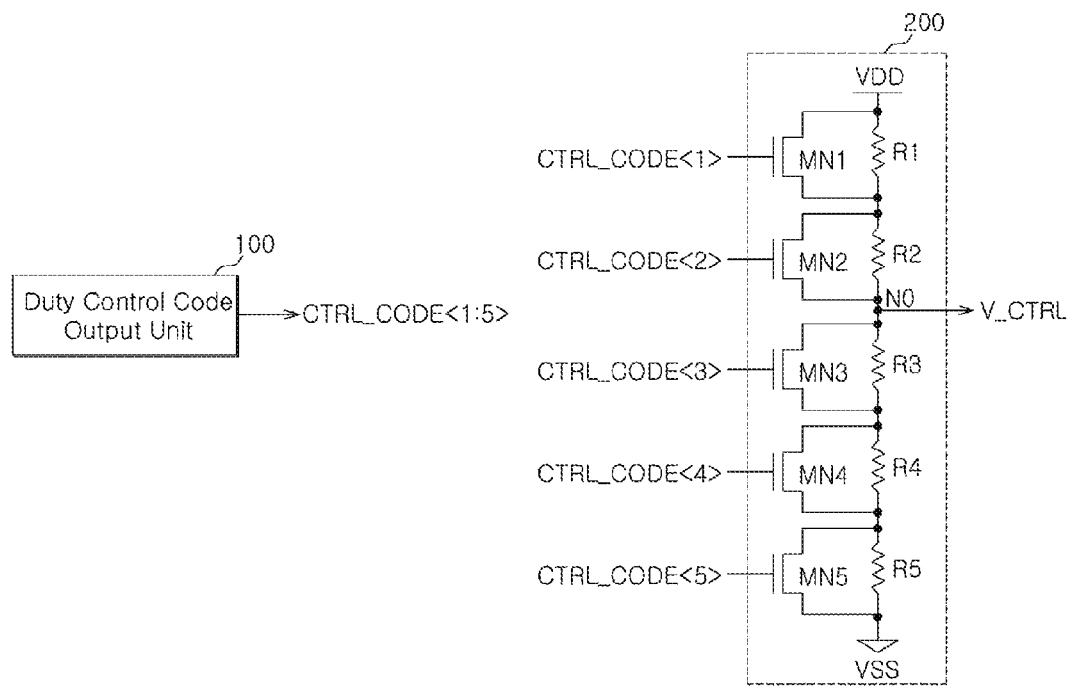
FIG. 1 is a configuration diagram illustrating a clock duty correction circuit according to one embodiment.
Figure 1:
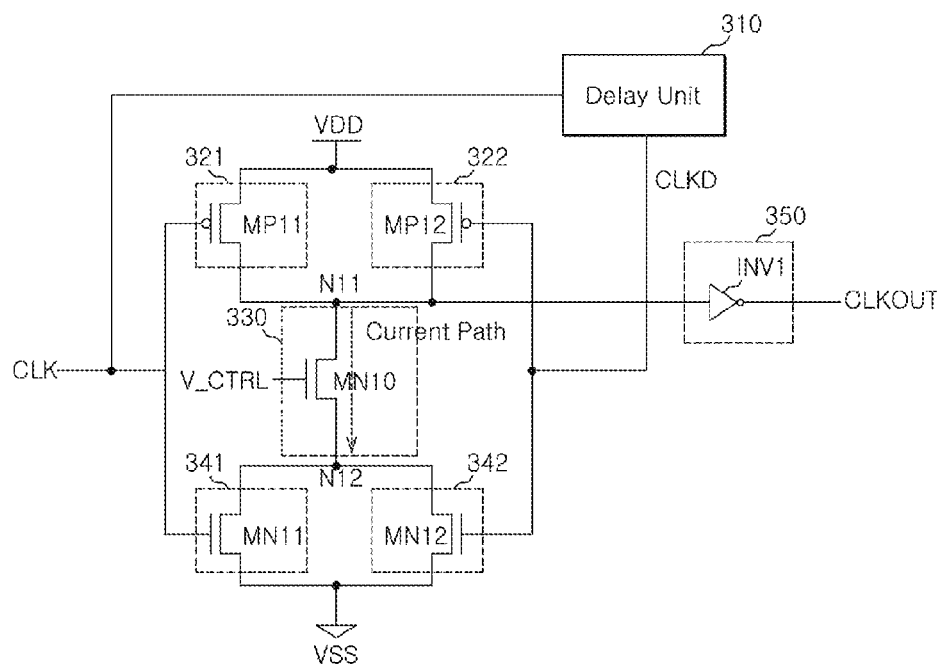

A clock duty correction circuit according to the present invention is described below with reference to the accompanying drawings through exemplary embodiments.

It should be noted for reference that, since terms, symbols or signs used in the drawings and detailed description to designate devices, blocks, or so on may be used for detailed units as need, the is same terms, symbols or signs may not designate the same devices, blocks, or so on in the entire circuitry. In general, the logic signals of a circuit and binary data values are divided into a high level (H) or a low level (L) in correspondence to voltage levels and may be represented as '1' and '0'. Furthermore, a high impedance state (a high-Z state) may be defined and described as needed.

FIG. 1 is a configuration diagram illustrating a clock duty correction circuit according to one embodiment.

The clock duty correction circuit according to this embodiment is configured simply in order to clearly describe the technical principles of the invention.

Referring to FIG. 1, the clock duty correction circuit includes a first current sourcing unit 321, a second current sourcing unit 322, a first current sinking unit 341, a second current sinking unit 342, a current adjustment unit 330, and a clock output unit 350. For reference, the clock duty correction circuit according to this embodiment may further include a delay unit 310, a duty control code output unit 100, and/or a control voltage generation unit 200.

The detailed configuration and principal operations of the clock duty correction circuit configured as described above are to described below.

The duty control code output unit 100 is configured to output duty control codes CTRL_CODE <1:5>. The duty control codes CTRL_CODE <1:5> may be defined as signals transmitted from a mode register set (MRS), or as a code transmitted from the outside is in a test mode. The duty control code output unit 100 includes a latch section that stores the duty control codes CTRL_CODE <1:5>, and may also include an option fuse set.

The control voltage generation unit 200 is configured to generate a control voltage V_CTRL having voltage levels corresponding to code values of the duty control codes CTRL_CODE <1:5>. The control voltage generation unit 200 includes a first voltage drop element group R1 and R2, a second voltage drop element group R3, R4 and R5, and a distribution adjustment section MN1 to MN5. The first voltage drop element group R1 and R2 is coupled between a supply voltage terminal VDD and a control voltage output terminal NO. The first voltage drop element group R1 and R2 includes a first resistor R1 and a second resistor R2. The second voltage drop element group R3, R4 and R5 is coupled between a ground voltage terminal VSS and a control voltage output terminal NO. The second voltage drop element group R3, R4 and R5 includes a third resistor R3, a fourth resistor R4, and a fifth resistor R5. The distribution adjustment section MN1 to MN5 is configured to adjust a voltage distribution ratio between the first voltage drop element groups R1 and R2 and the second voltage drop element groups R3, R4 and R5 according to the values of the duty control codes CTRL_CODE <1:5>. The distribution control section MN1 to MN5 includes a plurality of NMOS transistors controlled by the duty control codes CTRL_CODE <1:5>. The control voltage generation unit 200 is configured to control the ratio of resistance values of the first voltage is drop element groups R1 and R2 and the second voltage drop element groups R3, R4 and R5 according to duty control codes CTRL_CODE <1:5>, thereby outputting control voltage V_CTRL distributed according to the controlled ratio of the resistance values.

The delay unit 310 is configured to delay a clock signal CLK by a predetermined delay value and to output a delay clock signal CLKD. The delay unit 310 may comprise a general delay element.

The first current sourcing unit 321 is configured to source a current to a current path under the control of the clock signal CLK. The first current sourcing unit 321 includes a first sourcing transistor MP11, which is coupled between supply voltage terminal VDD and first node N11 and controlled by clock signal CLK.

The second current sourcing unit 322 is configured to source a current to the current path under the control of a delay clock signal CLKD obtained by delaying clock signal CLK by a predetermined time. The second current sourcing unit 322 includes a second sourcing transistor MP12 which is coupled between supply voltage terminal VDD and first node N11 and controlled by delay clock signal CLKD.

The first current sinking unit 341 is configured to sink the current of the current path under the control of clock signal CLK. The first current sinking unit 341 includes a first sinking transistor MN11 which is coupled between ground voltage terminal VSS and second node N12 and controlled by clock signal CLK.

The second sinking unit 342 is configured to sink the current of the current path under the control of delay clock signal CLKD. The is second current sinking unit 342 includes a second sinking transistor MN12 which is coupled between ground voltage terminal VSS and second node N12 and controlled by delay clock signal CLKD.

The current adjustment unit 330 is configured to adjust the amount of the current flowing through the current path according to the voltage level of control voltage V_CTRL. The current adjustment unit 330 includes a transistor MN10 which is coupled between first node N11 and second node N12 and controlled by control voltage V_CTRL. Therefore, transistor MN10 is configured to control a large amount of current to flow through the current path as the voltage level of the control voltage V_CTRL is increased.

The clock output unit 350 is configured to output an output clock signal CLKOUT having a voltage level corresponding to the amount of current flowing through current adjustment unit 330. The clock output unit 350 includes an inverter INV1 configured to buffer a signal outputted from first node N11 and to output the output clock signal CLKOUT.

Figure 2:
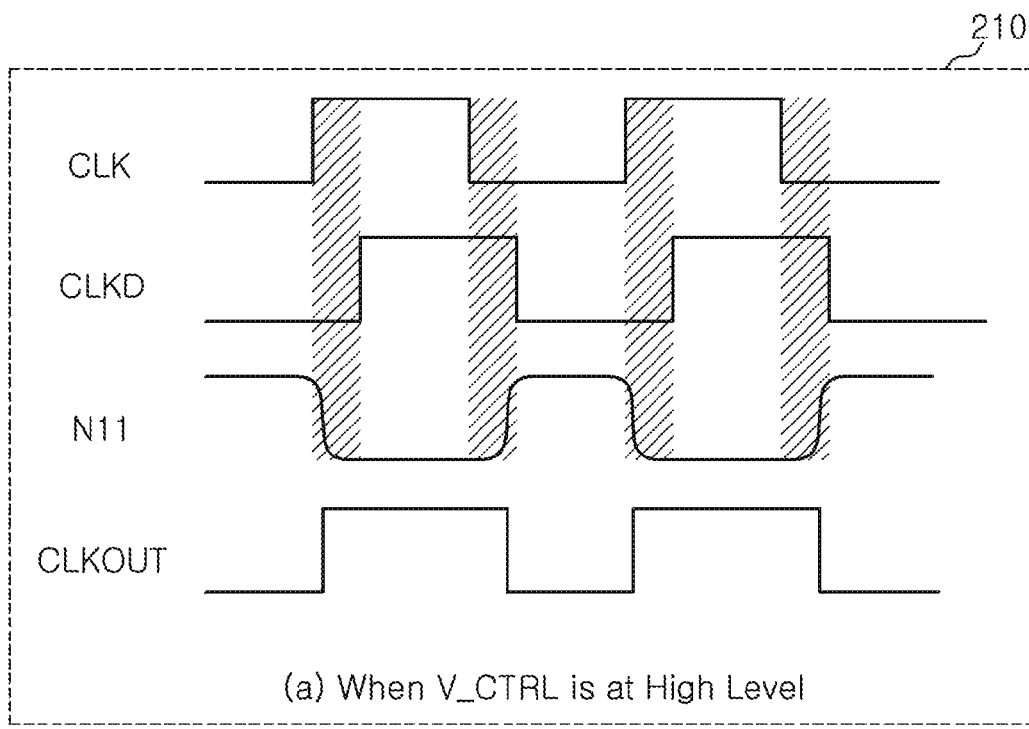
FIG. 2 is a diagram illustrating the internal operation of a clock duty correction circuit according to one embodiment.
Figure 2:
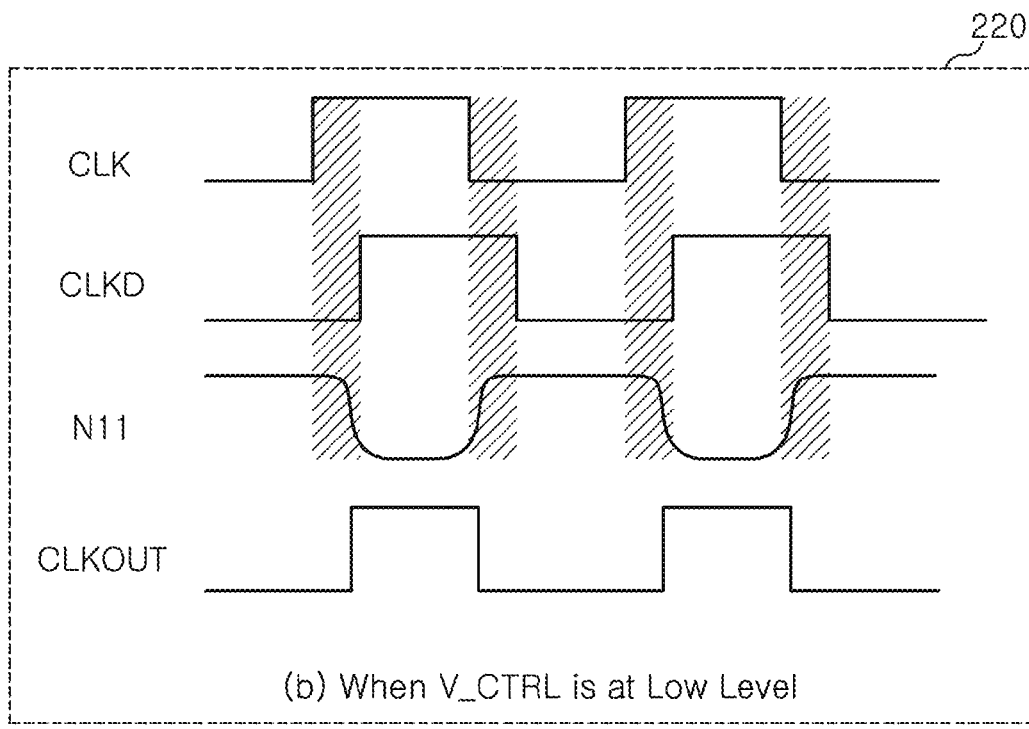

FIG. 2 is a diagram illustrating the internal operation of the clock duty correction circuit according to one embodiment.

The operation of the clock duty correction circuit configured as mentioned above is described below with reference to FIGS. 1 and 2. The first signal diagram 210 of FIG. 2 shows the operation of the clock duty correction circuit when control voltage V_CTRL is at a relatively high level. The second signal diagram 210 of FIG. 2 shows the operation of the clock duty correction circuit when control voltage V_CTRL is at a relatively low level.

The shaded areas of clock signal CLK and delay clock signal CLKD have phases that are inverse to each other. In other words, in the shaded areas, when clock signal CLK is at a high level, delay clock signal CLKD is at a low level. Conversely, when delay clock signal CLKD is at a high level, clock signal CLK is at a low level.

When clock signal CLK is at a high level and delay clock signal CLKD is at a low level, second current sourcing unit 322 and first current sinking unit 341 are simultaneously turned on. The voltage level of first node N11 is determined in accordance with a current driving force of second current sourcing unit 322 and first current sinking unit 341. Since the current driving force of second current sourcing unit 322 and first current sinking unit 341 is fixed, the voltage level of first node N11 is in effect determined by current adjustment unit 330.

When clock signal CLK is at a low level and delay clock signal CLKD is at a high level, first current sourcing unit 321 and second current sinking unit 342 are simultaneously turned on. The voltage level of first node N11 is determined in accordance with a current driving force of first current sourcing unit 321 and second current sinking unit 342. Since the current driving force of first current sourcing unit 321 and second current sinking unit 342 is fixed, the voltage level of first node N11 is in effect determined by current adjustment unit 330.

The operation of the clock duty correction circuit based on variation in the signal level of first node N11 is described below. When the voltage level of control voltage V_CTRL is at a relatively high level (210), since a large amount of current flows through transistor MN10, the falling time point of first node N11 is advanced and the rising time point thereof is delayed. As a result, since output clock signal CLKOUT has a phase inverse to that of the voltage level of first node N11, the high-level time period of output clock signal CLKOUT is increased relative to the low-level time period thereof.

When the voltage level of control voltage V_CTRL is at a relatively low level (220), since a relatively small amount of current flows through transistor MN10, the falling time point of first node N11 is delayed and the rising time point thereof is advanced. As a result, since output clock signal CLKOUT has a phase inverse to that of the voltage level of first node N11, the high-level time period of output clock signal CLKOUT is increased relative to the low-level time period thereof. As such, the voltage level of control voltage V_CTRL is adjusted, and, consequently, the ratio of the high level time period to the low level time period, that is, the clock duty, may be adjusted.

Figure 3:
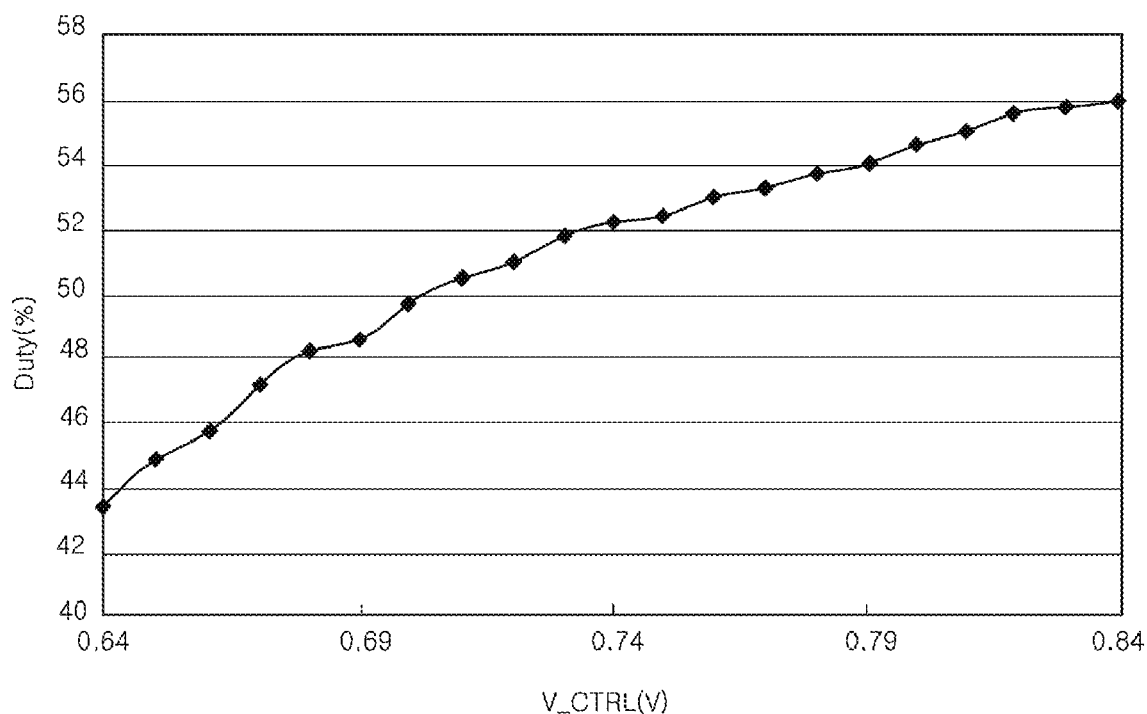
FIG. 3 is a diagram illustrating the duty of a clock varying depending on the voltage level of a control voltage.

FIG. 3 is a diagram illustrating the clock duty that varies according to the voltage level of a control voltage.

FIG. 3 shows the duty varying according to the control voltage V_CTRL when one period of clock signal CLK is approximately 0.8 ns. Here, control voltage V_CTRL may be adjusted in the range of approximately 0.64V to approximately 0.84V, and the duty may be adjusted in the range of approximately 44% to approximately 56%. The maximum adjustment range of the duty may be determined by the size of the transistors constituting the clock duty correction circuit and the adjustment range of the control voltage V_CTRL.

The clock duty correction circuit according to the embodiment is advantageous in terms of current consumption and area requirement, because the clock duty correction circuit uses a relatively small number of transistors. Furthermore, since the internal clock transmission path of the clock duty correction circuit is very short, a relatively stable output clock signal may be outputted, even if power noise or the like is introduced. For reference, when the clock duty correction circuit of the embodiment is applied to a delay locked loop (DLL), it may be possible to stably adjust the duty ratio of a DLL clock signal outputted from the delay locked loop. The clock duty correction circuit according to the embodiment has low current consumption and a wide range of adjustment.

So far, certain embodiments of the present invention have been described in detail. For reference, embodiments including additional component elements not directly associated with the technical principle of the present invention may be available. Moreover, the detailed configurations may vary from one embodiment to another. Since differences between the potential embodiments are too numerous to mention, and in any case can be easily inferred by those skilled in the art, they will not be enumerated herein.

While certain embodiments have been described above, it will be understood by those skilled in the art that such embodiments are by way of example only. Accordingly, the clock duty correction circuit described herein is not limited by the described embodiments. Rather, the clock duty correction circuit described herein is limited only in light of the claims that follow when taken in conjunction with the above description and accompanying drawings.

What is claimed is:

1. A clock duty correction circuit comprising:
a first current sourcing unit configured to source a current to a current path in response to a clock signal;
a first current sinking unit configured to sink the current of the current path in response to the clock signal;
a second current sourcing unit configured to source a current to the current path in response to a delay clock signal obtained by delaying the clock signal by a predetermined time;
a second current sinking unit configured to sink the current of the current path in response to the delay clock signal;
a current adjustment unit configured to adjust an amount of the current flowing through the current path according to a voltage level of a control voltage; and
a clock output unit configured to output an output clock signal having a voltage level corresponding to the amount of the current flowing through the current adjustment unit.

2. The clock duty correction circuit according to claim 1, further comprising a delay unit configured to delay the clock signal by a predetermined delay value to output the delay clock signal.

3. The clock duty correction circuit according to claim 1, further comprising a control voltage generation unit configured to generate the control voltage having a voltage level corresponding to a code value of a duty control code.

4. The clock duty correction circuit according to claim 3, further comprising a duty control code output unit which is configured to output the duty control codes.

5. The clock duty correction circuit according to claim 4, wherein the duty control code output unit comprises a latch section which is configured to store the duty control codes.

6. The clock duty correction circuit according to claim 3, wherein the duty control codes are transmitted from a mode register set.

7. The clock duty correction circuit according to claim 3, wherein the control voltage generation unit comprises:
a first voltage drop element group coupled between a supply voltage terminal and a control voltage output terminal;
a second voltage drop element group coupled between a ground voltage terminal and the control voltage output terminal; and
a distribution adjustment section configured to adjust a voltage distribution ratio between the first voltage drop element group and the second voltage drop element group according to the code values of the duty control codes.

8. The clock duty correction circuit according to claim 7, wherein the distribution adjustment section comprises a plurality of switching elements controlled by the duty control codes.

9. The clock duty correction circuit according to claim 7, wherein the voltage level of the voltage control is determined by the voltage distribution ratio.

10. The clock duty correction circuit according to claim 3, wherein the first current sourcing unit comprises a first sourcing transistor which is coupled between a supply voltage terminal and a first node and controlled by the clock signal.

11. The clock duty correction circuit according to claim 10, wherein the second current sourcing unit comprises a second sourcing transistor which is coupled between the supply voltage terminal and the first node and controlled by the delay clock signal.

12. The clock duty correction circuit according to claim 11, wherein the first current sinking unit comprises a first sinking transistor which is coupled between a ground voltage terminal and a second node and controlled by the clock signal.

13. The clock duty correction circuit according to claim 12, wherein the second current sinking unit comprises a second sinking transistor which is coupled between the ground voltage terminal and the second node and controlled by the delay clock signal.

14. The clock duty correction circuit according to claim 13, wherein the current adjustment unit comprises a transistor which is coupled between the first node and the second node and controlled by the control voltage.

15. The clock duty correction circuit according to claim 14, wherein the clock output unit comprises a buffering section which is configured to buffer a signal outputted from the first node to output the output clock signal.

16. The clock duty correction circuit according to claim 1, wherein the first current sourcing unit comprises a first sourcing transistor, which is coupled between a supply voltage terminal and a first node and controlled by the clock signal.

17. The clock duty correction circuit according to claim 16, wherein the second current sourcing unit comprises a second sourcing transistor which is coupled between the supply voltage terminal and the first node and controlled by the delay clock signal.

18. The clock duty correction circuit according to claim 17, wherein the first current sinking unit comprises a first sinking transistor which is coupled between a ground voltage terminal and a second node and controlled by the clock signal.

19. The clock duty correction circuit according to claim 18, wherein the second current sinking unit comprises a second sinking transistor which is coupled between the ground voltage terminal and the second node and controlled by the delay clock signal.

20. The clock duty correction circuit according to claim 19, wherein the current adjustment unit comprises a transistor which is coupled between the first node and the second node and controlled by the control voltage.

21. The clock duty correction circuit according to claim 20, wherein the clock output unit comprises a buffering section which is configured to buffer a signal outputted from the first node to output the output clock signal.

* * * * *